(12) United States Patent
Nehrke et al.

(10) Patent No.: US 6,587,707 B2
(45) Date of Patent: Jul. 1, 2003

(54) MR IMAGING METHOD WITH MOTION COMPENSATION

(75) Inventors: Kay Nehrke, Elmshorn (DE); Peter Boernert, Hamburg (DE); Bernd Aldefeld, Hamburg (DE); Michael Harald Kuhn, Hamburg (DE); Dirk Manke, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/880,197

(22) Filed: Jun. 13, 2001

(65) Prior Publication Data

US 2002/0026115 A1 Feb. 28, 2002

(30) Foreign Application Priority Data

Jun. 15, 2000 (DE) ........................................ 100 29 592

(51) Int. Cl.[7] .............................................. A61B 5/055
(52) U.S. Cl. ...................... 600/410; 600/407; 600/413; 600/419; 600/428; 324/306; 324/307; 324/309
(58) Field of Search ................................. 600/410, 413, 600/428, 419, 407; 324/306, 307, 309

(56) References Cited

U.S. PATENT DOCUMENTS

| | | | | |
|---|---|---|---|---|
| 5,545,993 A | * | 8/1996 | Taguchi et al. | 324/309 |
| 5,800,354 A | * | 9/1998 | Hofland et al. | 600/410 |
| 6,067,465 A | * | 5/2000 | Foo et al. | 600/410 |
| 6,088,611 A | * | 7/2000 | Lauterbur et al. | 600/407 |
| 6,292,683 B1 | * | 9/2001 | Gupta et al. | 600/410 |
| 6,295,464 B1 | * | 9/2001 | Metaxas | 600/407 |

* cited by examiner

Primary Examiner—Marvin M. Lateef
Assistant Examiner—Devaang Shah
(74) Attorney, Agent, or Firm—John Vodopia

(57) ABSTRACT

An MR imaging method wherein motion of an object to be imaged is examined during a preparation phase preceding the actual MR examination. The necessary sequences for the subsequent MR examination are modified during the examination to compensate for the motion based on motion parameters calculated during the preparation phase or motion parameters derived from the motion parameters calculated during the preparation phase based on a correlation between the motion parameters.

20 Claims, 4 Drawing Sheets

MR IMAGING METHOD WITH MOTION COMPENSATION

FIELD OF THE INVENTION

The invention relates to a method for magnetic resonance imaging of a moving object in an examination zone, wherein the nuclear magnetization is excited during an MR examination in the presence of a steady magnetic field by sequences which include at least a respective RF pulse of defined frequency. A number of MR signals received with a defined phase position and produced under the influence of additional magnetic gradient fields are evaluated. A motion parameter of the object is continuously measured for motion compensation and the parameters of the sequence are varied in dependence on or based on the measurement. The invention also relates to an MR apparatus for carrying out the method as well as to a computer program for controlling the control unit of an MR apparatus such that the method can be executed.

BACKGROUND OF THE INVENTION

Moving objects must be imaged in particular in the field of medical imaging, for example, the heart or the coronary vessels. In this respect, it is known from a study by Wang et al. (MRM 33:713–719 (1995)) that the displacement of the human heart is proportional to the respiration-induced diaphragm motion. Therefore, the cardiac motion can be at least partly compensated for by monitoring the motion of the diaphragm, for example, by means of so-called navigator pulses and by varying the frequency or the phase of the RF pulse or the phase position of the MR signals in dependence thereon, i.e., based thereon (so-called slice tracking), thus reducing the motion artefacts in the MR image.

In another embodiment of the invention which offers even more accurate motion compensation, at least two motion parameters for a motion direction are derived from the measured motion parameters and motion is additionally compensated for by varying the magnetic gradient fields. This provides more accurate motion compensation because when at least two motion parameters are measured, motions that are more complex than a simple translation can be compensated. For example, it is possible to take into account the fact that the heart is compressed or expanded under the influence of the diaphragm motion. Such compression or expansion, but also rotation, however, can be compensated only by varying the magnetic gradient fields acting during a sequence in addition to the frequency and the phase position of the RF pulse or the MR signal.

In order to mitigate this drawback, a publication by Taylor et al in ISMRM, 322 (1998) proposes to derive individual correction factors from MR images that are acquired prior to the actual MR examination, and show the heart in different respiratory phases. This enables more accurate compensation, but the acquisition of the individual correction factors necessitates careful evaluation of the previously formed MR images by the examiner.

OBJECTS AND SUMMARY OF THE INVENTION

It is the object of the present invention to provide a method for imaging a moving object in which a comparatively accurate motion compensation is achieved in a simple manner. This object is achieved in accordance with the invention by performing the following steps:

measuring the variation in time of a number of correlated motion parameters during a preparation phase preceding the MR examination, measuring a portion of the correlated motion parameters during the MR examination, deriving the motion parameters that have not been measured during the MR examination from the measured motion parameters, and varying the parameters of the sequence based on the calculated or measured motion parameters in order to achieve motion compensation.

In conformity with the invention the individual adaptation takes place during a preparation phase that precedes the actual MR examination n correlated motion parameters are then measured quasi simultaneously. The correlation between the individual motion parameters can be derived from such a measurement. During the subsequent MR examination it is merely necessary to measure m motion parameters (for example, the diaphragm motion, m=1) wherefrom the other motion parameters can be derived on the basis of the previously determined correlation. The parameters of the sequence (for example, frequency or phase position of the RF pulse or the MR signal) can be varied in dependence thereon in such a manner that motion compensation is achieved.

The method in accordance with the invention is executed automatically and does not require evaluation of previously formed MR images by an examiner. Even though a large number (n) of motion parameters must be measured for the exact motion compensation, the actual MR examination is not affected thereby, because the acquisition of such motion parameters takes place during the preceding preparation phase.

In another embodiment of the invention which offers even more accurate motion compensation, at least two motion parameters for a motion direction are derived from the measured motion parameters and motion is additionally compensated for by varying the magnetic gradient fields. This provides more accurate motion compensation because when at least two motion parameters are measured, motions that are more complex than a simple translation can be compensated. For example, it is possible to take into account the fact that the heart is compressed or expanded under the influence of the diaphragm motion. Such compression or expansion, but also rotation, however, can be compensated only by varying the magnetic gradient fields acting during a sequence in addition to the frequency and the phase position of the RF pulse or the MR signal.

The version of the method that is disclosed in claim 2 offers even more accurate motion compensation. The reason is that with at least two motion parameters are measure, motions that are more complex than a simple translation can be compensated. For example, it is thus possible to take into account the fact tat the heart is compressed or expanded under the influence of the diaphragm motion. Such compression or expansion, but also rotation, however, can be compensated only by varying, in addition to the frequency and the phase position of the RF pulse or the MR signal, the magnetic gradient fields acting during a sequence.

For the measurement of the motion parameters, navigator pulses may be used to enable the excitation of a volume that is limited in two dimensions, for example a cylindrical rod (pencil beam). For example, when such a navigator pulse is incident on the diaphragm of a patient, the state of motion thereof, or the patient's respiration, can be determined by evaluation of the MR signals received after the navigator pulse. The motion of a spatially limited volume can thus be accurately measured.

In connection with the imaging of the heart (or the coronary vessels), the sequences may be generated under the control of an ECG. The heart moves not only under the influence of respiratory motion, but also because of the cardiac action, a cardiac cycle being significantly shorter than a respiratory cycle. During the late diastole of the cardiac action (briefly before the R wave in the ECG), however, there is a low-motion phase of approximately 100 ins. When the sequences are produced exclusively during such a low motion phase, the cardiac cycle will not introduce any additional motion artefacts.

The time necessary for the acquisition of all required MR signals can be reduced by generating a number of successive sequences per cardiac cycle after measurement of the motion parameters. To this end, it is necessary to utilize sequences whose duration is shorter than that of the low-motion phase of the heart. However, because this phase is short in comparison with a respiratory cycle, it suffices to measure the motion parameters only once during the relevant cardiac cycle.

An MR apparatus in accordance with the invention includes a magnet for generating a uniform, steady magnetic field, an RF transmitter for generating magnetic RF pulses, a receiver for receiving MR signals, a generator for generating gradient magnetic fields with gradients that vary differently in time and in space, an evaluation unit for processing the received MR signals, and a control unit arranged to control the RF transmitter, the receiver, the generator and the evaluation unit. The control unit is programmed to measure a variation in time of a plurality of correlated motion parameters during a preparation phase preceding an examination phase, measure only a portion of the correlated motion parameters during the examination phase, derive a remaining portion of the motion parameters which are not measured during the examination phase from the measured motion parameters and vary at least one parameter of a sequential generation of a magnetic field during the examination phase based on the derived or measured motion parameters in order to achieve motion compensation. A computer program for a control unit controlling the execution of the method in such an MR apparatus includes means for measuring the variation in time of a plurality of correlated motion parameters during a preparation phase preceding an examination phase, means for measuring only a portion of the correlated motion parameters during the examination phase, means for deriving the motion parameters which are not measured during the examination phase from the measured motion parameters, and means for varying at least one paramerer of a sequential generation of a magnetic field during an examination phase based on the derived or measured motion parameters in order to achieve motion compensation.

BRIEF DESCRIPTION OF THE DRAWINGS

The invention will be described in detail hereinafter with reference to the drawings. Therein.

DETAILED DESCRIPTION OF THE INVENTION

Figure 1:
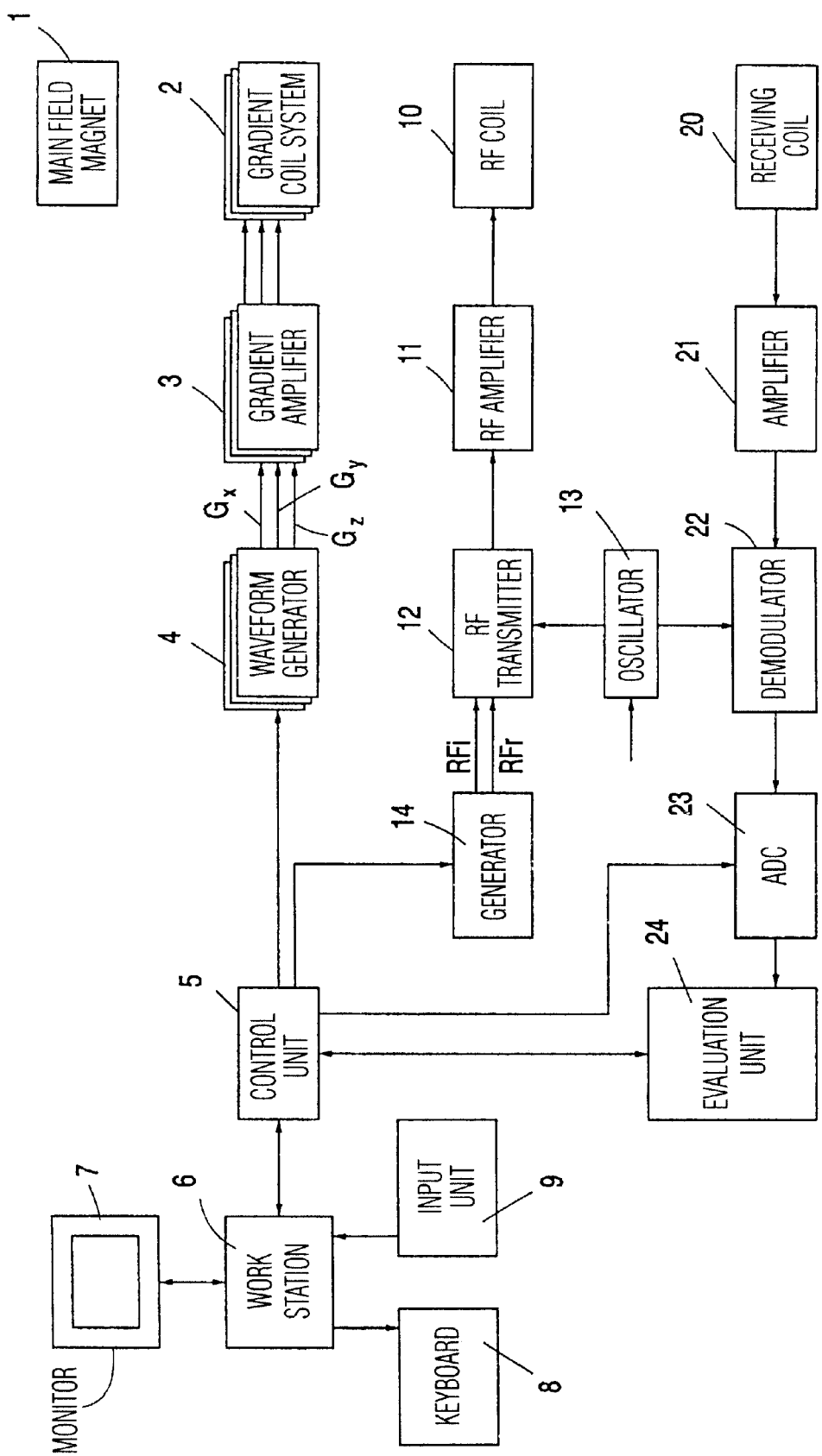
FIG. 1 shows an MR apparatus that is suitable for carrying out the invention.

The reference numeral 1 in FIG. 1 denotes a diagrammatically represented main field magnet which generates, a steady, essentially uniform magnetic field Bo which extends in the z direction in an examination zone (not shown) and has a strength of, for example 1.5 Tesla. The z direction extends in the longitudinal direction of an examination table (not shown) on which a patient is accommodated during an examination.

Also provided is a gradient coil system 2 which includes three coil systems that are capable of generating gradient magnetic fields $G_x$, $G_y$ and $G_z$ which extend in the z direction and have a gradient in the x, the y and the z direction, respectively. The currents for the gradient coil system 2 are supplied by a gradient amplifier 3. Their variation in time is governed by a respective waveform generator, that is, separately for each direction. The waveform generator 4 is controlled by an arithmetic and control unit 5 which calculates the variation in time of the magnetic gradient fields $G_x$, $G_y$, $G_z$ that is required for a given examination method, and loads this variation into the waveform generator 4. During the MR examination these signals are read out from the waveform generator 4 and applied to the gradient amplifier 3 which forms the currents required for the gradient coil system 2 therefrom. The control unit 5 also acts on a work station 6 which includes a monitor 7 for the display of MR images. Entries can be made via a keyboard 8 or an interactive input unit 9.

The nuclear magnetization in the examination zone can be excited by RF pulses from an RF coil 10 which is connected to an RF amplifier 11 which amplifies the output signals of an RF transmitter 12. In the RF transmitter 12 the (complex) envelopes of the RF pulses are modulated on the carrier oscillations that are supplied by an oscillator 13 and whose frequency corresponds essentially to the Larmor frequency (approximately 63 MHz in the case of a main magnetic field of 1.5 Tesla). The arithmetic and control unit 5 loads the frequency and the phase position, or the complex envelope, of the RF pulses into a generator 14 which is coupled to the transmitter 12.

The MR signals generated in the examination zone are picked up by a receiving coil 20 and amplified by an amplifier 21. The amplified MR signal is demodulated in a quadrature demodulator 22 by 290° mutually offset carrier oscillations of the oscillator 13, resulting in a complex MR signal whose phase can also be controlled by the control unit 5. The complex MR signals are applied to an analog-to-digital converter 23 which forms MR data therefrom. The MR data is subjected to various processing steps in an evaluation unit 24, that is, inter alia a Fourier transformation, in order to form MR images.

Figure 2:
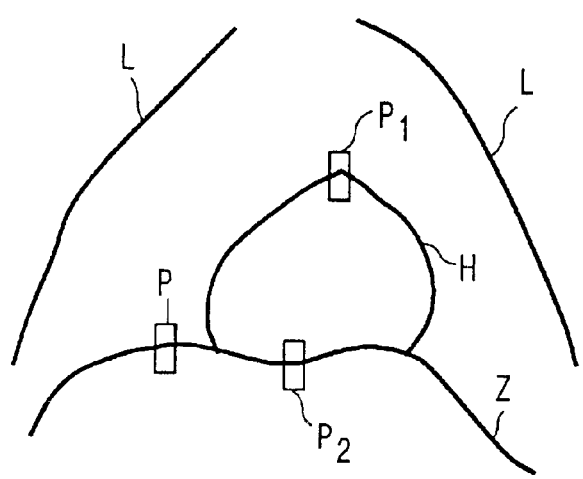
FIG. 2 shows the location of the measuring points during the acquisition of the motion parameters.

FIG. 2 shows diagrammatically the location of the heart H in the thorax of a patient; the heart should be imaged with as few motion artefacts as possible during an MR examination. Also shown is the diaphragm Z and the pulmonary lobe L. The Figure also shows three measuring points in which the motion is measured. The measuring point P is situated on the diaphragm, that is, to the right of the heart (to the left in FIG. 2). The measuring point P1 is situated at the upper edge of the heart and the measuring point P2 at its lower edge.

The invention is based on the assumption that the respiration-induced motion of an arbitrary point of the heart can be described by an affine transformation in conformity with the equation $$R(r,t) = A(t) \cdot r_0 + r(t) \tag{1}$$

Therein, $R(r,t)$ is the path traveled by this point during the respiratory motion. $A(t)$ is a global (that is, valid for all points on the moving object), time-dependent (3×3) transformation matrix that describes the rotation and expansion of the moving object H. The three-dimensional vector $r_0$ defines the position of an arbitrary anatomical point on the object H and r(t) is a vector describing the global, time-dependent shift of the object H. The motion of the heart as described by the equation (1) can be compensated (that is, an MR image can be formed which shows the moving object as if it has not moved) when the parameters of the imaging sequence are modified as follows:

a) Instead of the magnetic gradient field G(t), involving a vector with the time-dependent components $G_x$, $G_y$, and $G_z$ use is made of a compensating magnetic gradient field $G_c(t)$ which is calculated in conformity with the formula:

$$G_c(t) = (A^{-1}(t))^T \cdot G(t) \qquad (2)$$

Therein, $A^{-1}(t))^T$ is the inverse transposed matrix of the matrix A(t). The rotation or expansion of the moving object is thus compensated.

b) The phase of the RF magnetic field acting on the examination zone during the RF pulse is modulated with a phase factor $\Phi_s$ modulated in conformity with the relation $$\Phi_s(t) = e^{i\gamma u}(t) \qquad (3)$$

It then holds for u(t) that $$u(t) = \int_t^{t_1} G_C(t')^T r(t') dt' \qquad (4)$$

Therein, $G_c(t')^T$ is the transposed vector that occurs due to the interchanging of the rows and columns of the matrix G(t). The quantity $t_1$ denotes the end of an RF pulse.

c) The MR signal is modulated with a phase factor $\Phi_e(t)$ in conformity with the relation $$\Phi_e(t) = e^{i\gamma v(t)} \qquad (5)$$

It then holds for v(t) that:

$$v(t) = \int_{t_1}^{t} G_C(t')^T r(t') dt' \qquad (6)$$

The phase modulation of the RF pulse, or the MR signal, as indicated sub b) and c) changes the frequency and the phase of these signals, so that the translation of the object H is compensated for the MR imaging.

The nine elements of the matrix A(t) and the three components of the vector r(t) must be determined during the preparation phase preceding the actual MR examination. Assuming that the elements of the matrix A(t) are linearly independent of one another, up to 12 motion parameters would have to be measured for this purpose. However, this measurement can be significantly simplified by assuming that the object moves or expands only in the z direction, that is, in the longitudinal direction of the patient. The vector r(t) is then simplified as:

$$r(t) = \begin{pmatrix} 0 \\ 0 \\ f(t) \end{pmatrix} \qquad (7)$$

and the matrix A of t then becomes $$A(t) = \begin{pmatrix} 1 & 0 & 0 \\ 0 & 1 & 0 \\ 0 & 0 & b(t) \end{pmatrix} \qquad (8)$$

For this simplified motion model it is merely necessary to measure two motion parameters, for example the shift of the upper and the lower heart edge at the points $P_1$ and $P_2$ in FIG. 2.

Figure 3:
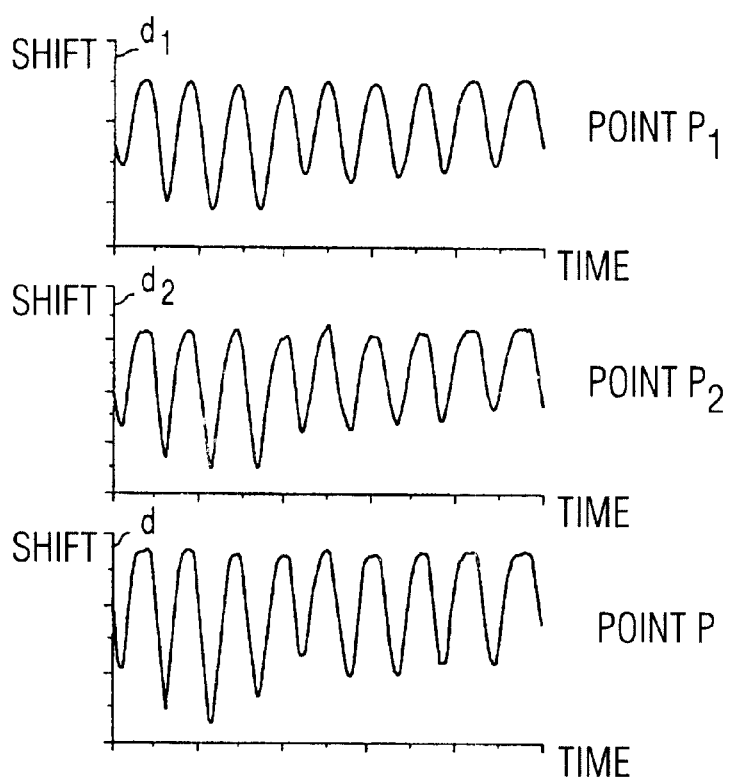
FIG. 3 shows the variation in time of the motion at the various measuring points.

Therefore, in the preparation phase the shift of the points, P, $P_1$ and $P_2$ in the z direction is measured during a few respiratory cycles while utilizing suitable navigator pulses. FIG. 3 shows the variation in time of the shifts d, $d_1$ and $d_2$ measured for the points P, $P_1$ and $P_2$, respectively. It appears that the displacement of the diaphragm under the influence of the respiratory motion is greater than that of the upper edge and the lower edge of the heart. The shift $d_2$ of the lower edge of the heart is larger than the shift $d_1$ of the upper edge of the heart.

Figure 4:
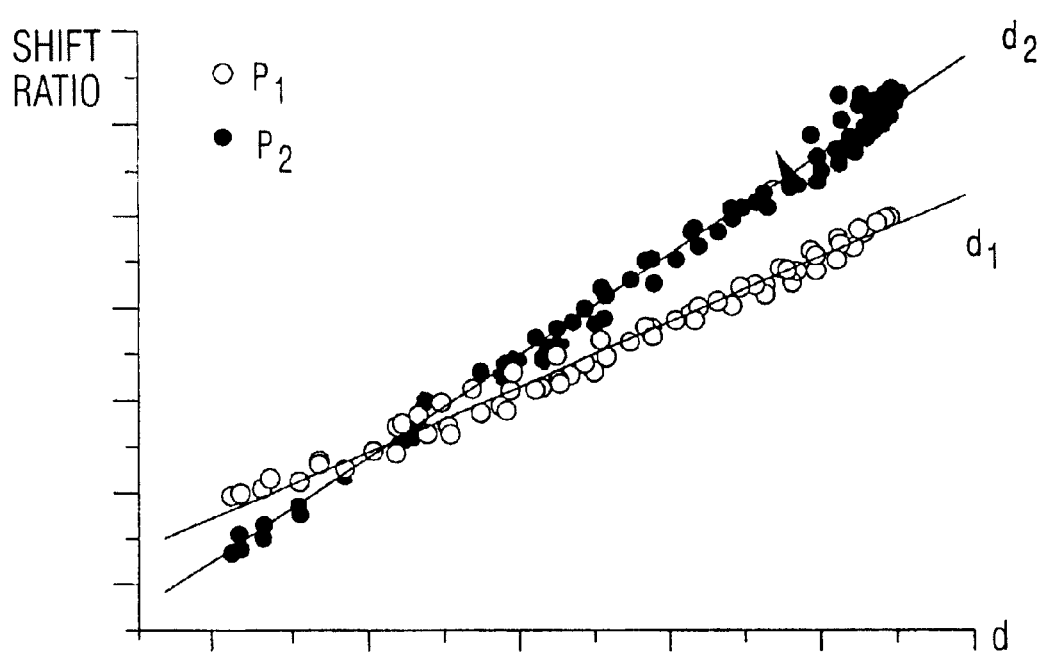
FIG. 4 shows the correlation between said motions.

When the values of $d_1$ and $d_2$ determined at given instants are plotted as a function of the value d determined at the same instant during the recurrent respiratory motion, the dependency of these values that describes the correlation of these values is obtained as shown in FIG. 4. Consequently, during the subsequent MR examination it is no longer necessary to measure the values $d_1$ and $d_2$, but merely the quantity d, that is, the motion of the diaphragm. The associated values of $d_1$ and $d_2$ are then obtained directly from the correlation shown in FIG. 4 (this correlation can be approximated by a respective straight line). The parameters b(t) and f(t) are then obtained as:

$$b(t) = \frac{d_1(t) - d_2(t)}{d_{1o} - d_{2o}} \qquad (9)$$

$$f(t) = d_1(t) - \frac{d_1(t) - d_2(t)}{d_{1o} - d_{2o}} d_{1o} \qquad (10)$$

Therein, $d_{1o}$ and $d_{2o}$ represent the values $d_1$ and $d_2$ at a reference point that can be selected at random, for example, at the end of exhalation.

During the subsequent MR examination merely the parameter d must be measured, that is, in addition to the imaging MR signals. Using the correlations shown in FIG. 4, the values b(t) and f(t) can then be determined in conformity with the equations 9 and 10; the matrix A(t) and the vector r(t) can be derived therefrom in conformity with the equations 7 and 8 and the parameters $G_c(t)$, $\Phi_s(t)$, $\Phi_e(t)$ can be calculated therefrom in conformity with the equations 2, 3 and 5.

Figure 5:
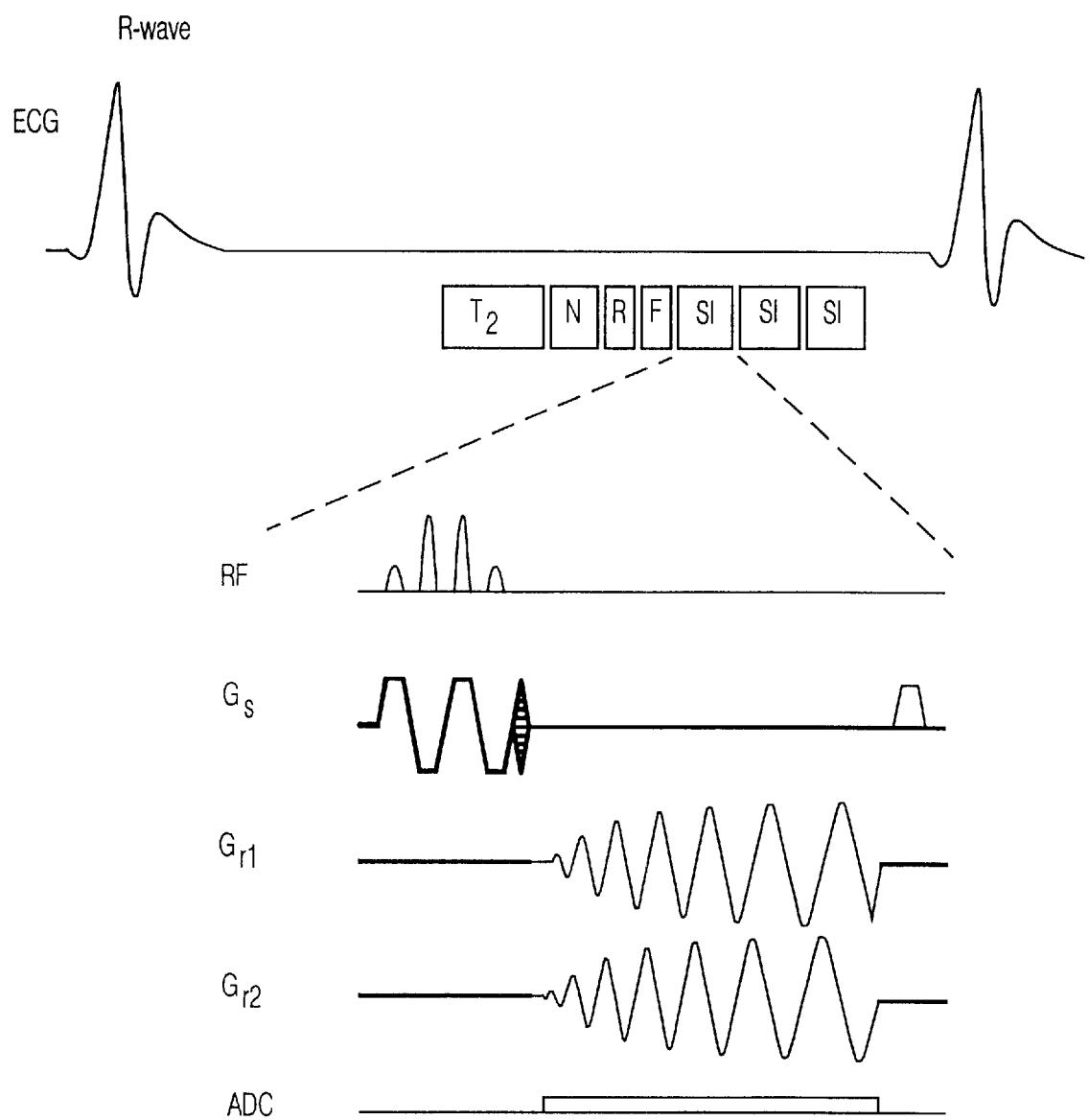
FIG. 5 shows a cardiac cycle and the situation of the various acquisition steps during the cardiac cycle, and shows the variation in time of a sequence during the MR imaging.

FIG. 5 shows the situation in time of the imaging sequences during the actual MR examination in relation to the variation in time of an ECG signal (first line of FIG. 5) during a single cardiac cycle. As is indicated by the blocks situated therebelow, the MR imaging operation includes a so-called $T_2$ preparation ($T_2$) which should not be mistaken for the preparation phase provided in conformity with the invention.

Subsequently, there is generated a navigator pulse N which excites the nuclear magnetization in a pencil-shaped zone above the point P (see FIG. 2). The position d of the diaphragm during the cardiac cycle can be derived from the MR signals thus produced; this position may be assumed to remain constant during the remainder of the cardiac cycle. Subsequently, therefrom the variations in time of $G_c(t), \phi_e(t)$ and $\phi_s(t)$ can be calculated in advance so as to be stored (for example, in the waveform generator 4 of FIG. 1). Prior to the actual imaging sequences (SI) a regional suppression pulse and a fat suppression pulse (F) can be generated; however, these steps may also be omitted.

In order to achieve motion compensation, the parameters in the next sequence must be changed. The variation in time of the gradient magnetic field $G(t)=(G_s(t), G_{r1}(t), G_{r2}(t))$ must be changed in conformity with the equation 2 for the value of d determined by means of the navigator pulse (N). The phase of the RF oscillation during the RF pulse RF must be modulated with the value $\Phi_s$ in conformity with the equation 3 and the received MR signal with the phase factor $\Phi_e$ in conformity with the equation 5.

Subsequently, during the late phase of the diastole of the cardiac cycle there are three imaging sequences with parameters that have been modified (as previously described) in dependence on the measured position d of the diaphragm Z. One of these sequences is shown in FIG. 5.

The third line of FIG. 5 shows the envelope of an RF pulse RF whose peaks coincide each time with the positive or the negative polarity of a slice-selective gradient $G_s$ (second line). The RF pulse RF is succeeded by phase encoding by activation of the gradient $G_s$, for a defined duration and with a selectable amplitude. Subsequently, an MR signal is read out by means of two periodic read-out gradients (fifth line and sixth line of FIG. 5) $G_{r1}$ and $G_{r2}$ of increasing amplitude which extend perpendicularly to one another and to the gradient $G_s$ (seventh line). As a result, the nuclear magnetization in the so-called k space is read out along a spiral arm. The sequence terminates in that the excited nuclear magnetization is dephased by a so-called "spoiler" of the gradient $G_s$. Subsequently the next sequence is applied, be it that the next gradients $G_{r1}$ and $G_{r2}$ have been modified in such a manner that the spiral arm followed in the k space has been offset, for example, 120° relative to the preceding spiral arm (or is subjected to a different phase encoding).

MR imaging can also be performed by means of other sequences that enable two-dimensional or three-dimensional imaging, for example by means of a so-called 3 DFT sequence.

Furthermore, it is also possible to apply so-called gating where only the MR signals acquired in given phases of the respiration are used to form an MR image. Motion artefacts remaining despite the motion compensation can thus be reduced, be it at the expense of a longer acquisition time. However, the prolongation in time is not as long as in the methods wherein the motion artefacts are to be avoided exclusively by gating, that is, without any motion compensation, because MR signals can be acquired only in a small part of the respiration cycle in such a case.

The invention can also be used for the imaging of other moving organs, for example the liver or a kidney or kidneys. Finally, the MR method in accordance with the invention can be used not only for the examination of the human body but also for other biological or technical systems.

What is claimed is:

1. A method for MR imaging of a moving object in an examination zone, comprising:
    correlating a plurality of motion parameters,
    measuring a variation in time of the correlated motion parameters during a preparation phase preceding an examination phase,
    measuring only a portion of the correlated motion parameters during the examination phase,
    deriving a remaining portion of the motion parameters which were not measured from the measured portion of the correlated motion parameters,
    exciting the nuclear magnetization in the presence of a steady magnetic field by sequences which include at least a respective RF pulse of defined frequency,
    evaluating MR signals received with a defined phase position and produced under the influence of additional magnetic gradient fields, and
    varying at least one parameter of the sequence based on at least one of the derived or measured motion parameters in order to achieve motion compensation.

2. A method as claimed in claim 1, further comprising:
    deriving at least two motion parameters for a motion direction from the measured motion parameters, and
    varying the magnetic gradient fields to provide additional motion compensation.

3. A method as claimed in claim 1, further comprising using navigator pulses for the measurement of the motion parameters.

4. A method as claimed in claim 1 wherein the object is a heart, further comprising generating the sequences under control of an ECG.

5. A method as claimed in claim 4, further comprising generating a number of successive sequences per cardiac cycle after measurement of the motion parameters.

6. An apparatus for MR imaging of a moving object, comprising:
    a magnet for generating a uniform, steady magnetic field,
    an RF transmitter for generating magnetic RF pulses,
    a receiver for receiving MR signals,
    a generator for generating gradient magnetic fields with gradients that vary differently in time and space,
    an evaluation unit for processing the received MR signals, and
    a control unit arranged to control the RF transmitter, the receiver, the generator and the evaluation unit, the control unit being programmed to measure a variation in time of a plurality of correlated motion parameters during a preparation phase preceding an examination phase, measure only a portion of the correlated motion parameters during the examination phase, derive a remaining portion of the motion parameters which are not measured during the examination phase from the measured motion parameters and vary at least one parameter of a sequential generation of the magnetic field during the examination phase based on at least one of the derived or measured motion parameters in order to achieve motion compensation.

7. A device for generating a computer program for a control unit for controlling an MR imaging apparatus, comprising:
    means for measuring the variation in time of a plurality of correlated motion parameters during a preparation phase preceding an examination phase,
    means for measuring only a portion of the correlated motion parameters during the examination phase,
    means for deriving the motion parameters which are not measured during the examination phase from the measured motion parameters, and
    means for varying at least one parameter of a sequential generation of a magnetic field during the examination phase based on at least one of the derived or measured motion parameters in order to achieve motion compensation.

8. A method as claimed in claim 1, wherein the at least one parameter of the sequence is varied based on a derived motion parameter.

9. A method as claimed in claim 1, wherein a plurality of parameters of the sequence are varied based on the derived or measured motion parameters.

10. A method as claimed in claim 1, wherein the variation in time of the correlated motion parameters is measured using navigator pulses.

11. A method as claimed in claim 1, wherein the object is a heart, the variation in time of the correlated motion parameters being measured during respiratory cycles using navigator pulses.

12. A method as claimed in claim 1, wherein only one motion parameter is measured during the examination phase.

13. A method as claimed in claim 1, wherein the parameters of the sequence which vary based on the motion parameters include the frequency of the RF pulse, the phase position of the RF pulse, and the magnetic field.

14. A method as claimed in claim 1, wherein the object is a heart, further comprising selecting the motion parameters as motion at a point on the diaphragm, motion at a point at an upper edge of the heart and motion at a point at a lower edge of the heart.

15. A method as claimed in claim 1, wherein the variation in time of the correlated motion parameters is measured simultaneously during the preparation phase.

16. An apparatus as claimed in claim 6, wherein the control unit is arranged to vary the at least one parameter based on a derived motion parameter.

17. An apparatus as claimed in claim 6, wherein the control unit is arranged to measure the variation in time of the correlated motion parameters using navigator pulses.

18. An apparatus as claimed in claim 6, wherein the control unit is arranged to measure only one motion parameter during the examination phase.

19. An apparatus as claimed in claim 6, wherein the at least one parameter which vary based on the motion parameters include the frequency of the RF pulse, the phase position of the RF pulse or the magnetic field.

20. An apparatus as claimed in claim 6, wherein the object is a heart, the motion parameters being motion at a point on the diaphragm, motion at a point at an upper edge of the heart and motion at a point at a lower edge of the heart.

* * * * *